United States Patent
Hollmer et al.

(10) Patent No.: US 9,336,868 B1
(45) Date of Patent: May 10, 2016

(54) COMMON PLATE SWITCHING REDUCTION IN RESISTIVE SWITCHING MEMORY DEVICES

(71) Applicant: Adesto Technologies Corporation, Sunnyvale, CA (US)

(72) Inventors: Shane Charles Hollmer, Grass Valley, CA (US); Derric Lewis, Sunnyvale, CA (US); John Dinh, Dublin, CA (US); Nad Edward Gilbert, Gilbert, AZ (US)

(73) Assignee: Adesto Technologies Corporation, Sunnyvale, CA (US)

( * ) Notice: Subject to any disclaimer, the term of this patent is extended or adjusted under 35 U.S.C. 154(b) by 151 days.

(21) Appl. No.: 13/909,983

(22) Filed: Jun. 4, 2013

(51) Int. Cl.
G11C 13/00 (2006.01)

(52) U.S. Cl.
CPC ........ G11C 13/0007 (2013.01); G11C 13/0064 (2013.01); G11C 13/0069 (2013.01); G11C 13/0097 (2013.01)

(58) Field of Classification Search
CPC ........... G11C 13/0007; G11C 11/5678; G11C 13/0002; G11C 13/0011; G11C 2013/009
USPC .................................. 365/148, 157, 158, 159
See application file for complete search history.

(56) References Cited

U.S. PATENT DOCUMENTS

| 7,385,868 | B2 * | 6/2008 | Moore et al. ................... 365/222 |
| 2007/0121376 | A1 * | 5/2007 | Toda ........................... 365/185.2 |
| 2012/0075911 | A1 * | 3/2012 | Nakura et al. ................. 365/148 |
| 2012/0303871 | A1 * | 11/2012 | Tokiwa ......................... 711/103 |
| 2013/0003450 | A1 * | 1/2013 | Bedeschi ....................... 365/163 |

* cited by examiner

Primary Examiner — Harry W Byrne
Assistant Examiner — Ajay Ojha
(74) Attorney, Agent, or Firm — Michael C. Stephens, Jr.

(57) ABSTRACT

Structures and operations of a resistive switching memory device are described herein. In one embodiment, a resistive switching memory device can include: a plurality of resistive memory cells, each configured to be programmed to a low resistance state by application of a first voltage in a forward bias direction, and erased to a high resistance state by application of a second voltage in a reverse bias direction; a plurality of common plates, each being connected to a subset of the resistive memory cells; a command detector configured to detect a write command to be executed as a first and second write operations; and a write controller configured to perform the first write operation on each resistive memory cell in a selected subset, and to perform the second write operation on at least one of the resistive memory cells in the selected subset based on the detected write command.

20 Claims, 11 Drawing Sheets

COMMON PLATE SWITCHING REDUCTION IN RESISTIVE SWITCHING MEMORY DEVICES

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device with reduced switching of a common plate coupled to the resistive memory cells.

In one embodiment, a resistive switching memory device can include: (i) a plurality of resistive memory cells, where each of the resistive memory cells is configured to be programmed to a low resistance state by application of a first voltage in a forward bias direction, and to be erased to a high resistance state by application of a second voltage in a reverse bias direction; (ii) a plurality of common plates, where each of the common plates is connected to a subset of the plurality of resistive memory cells; (iii) a command detector configured to detect a write command that is to be executed on the resistive switching memory device as a first write operation followed by a second write operation; and (iv) a write controller configured to perform the first write operation on each resistive memory cell in a selected of the subsets of resistive memory cells, and to perform the second write operation on at least one of the resistive memory cells in the selected subset based on the detected write command.

In one embodiment, a method of controlling a resistive switching memory device having a plurality of resistive memory cells arranged as subsets corresponding to common plates, can include: (i) detecting a write command to be executed as first and second write operations on the resistive switching memory device, where each of the resistive memory cells is programmable to a low resistance state by application of a first voltage in a forward bias direction, and erasable to a high resistance state by application of a second voltage in a reverse bias direction; (ii) performing the first write operation on each resistive memory cell in a selected subset of the plurality of resistive memory cells having a common plate connected thereto; and (iii) performing the second write operation on at least one of the resistive memory cells in the selected subset based on the detected write command.

Embodiments of the present invention can advantageously provide for reduced power and write cycle times. Particular embodiments are suitable for resistive switching memories, such as resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Architecture

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
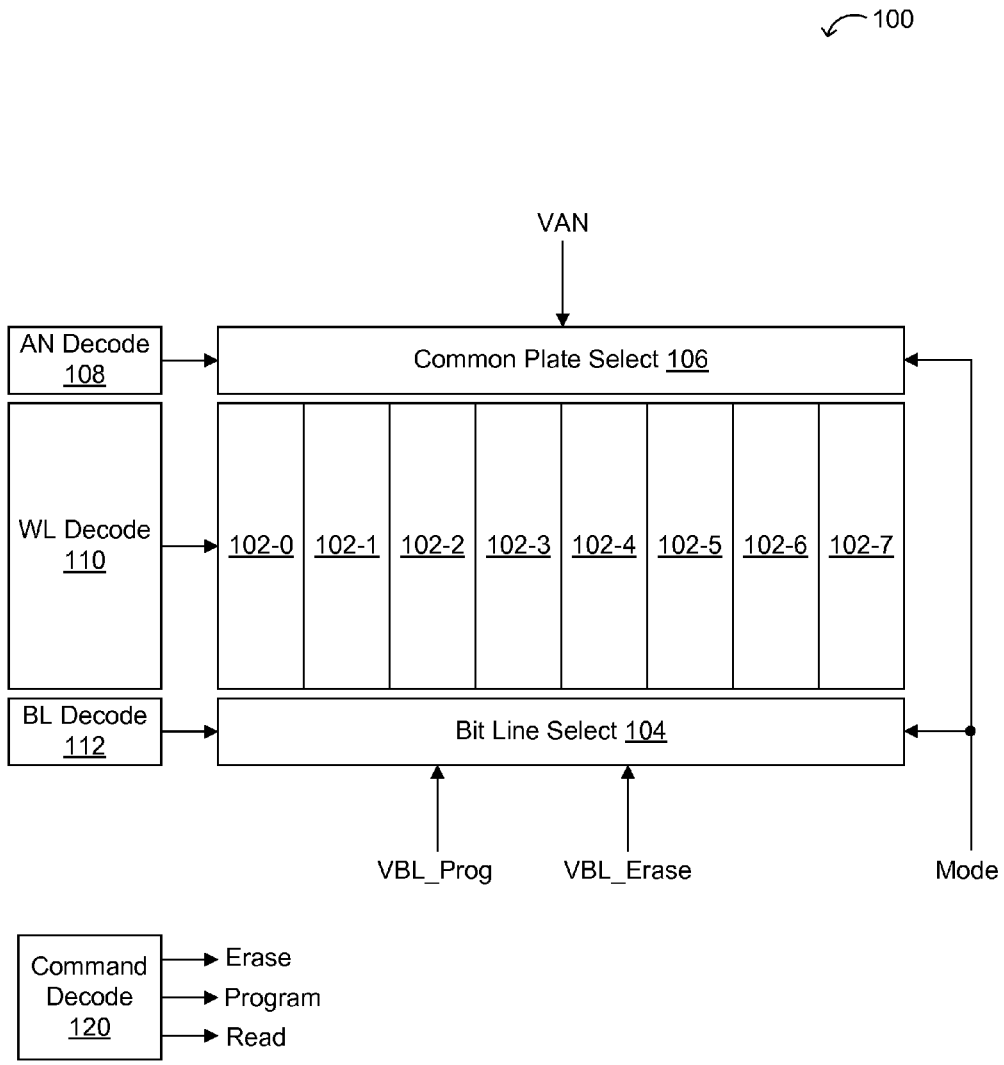
FIG. 1 is an example memory device arrangement.
Figure 2:
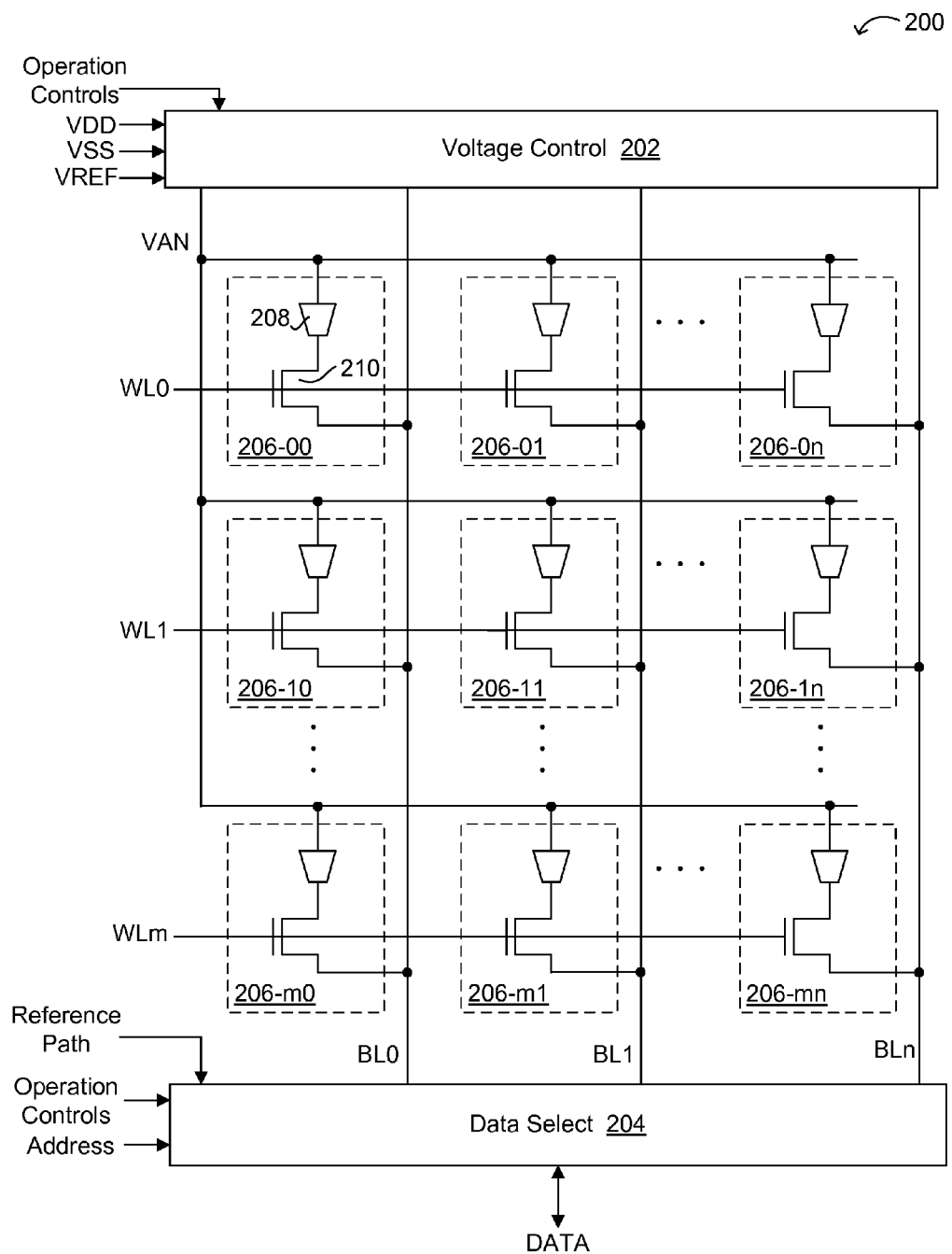
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a de-select voltage (e.g., low) by associated word line drivers. Bit line selection circuitry 104 can place bit lines BL0 and BL1 in the de-selected state. Similarly, common plate selection circuitry 106 can place common anode plates in the de-select state.

In a program operation, in response to address and mode data, bit line selection signals can be used to connect a selected bit line to read/write control circuitry via data select 204. In contrast, other bit lines can be de-selected, and thus placed in the de-selected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
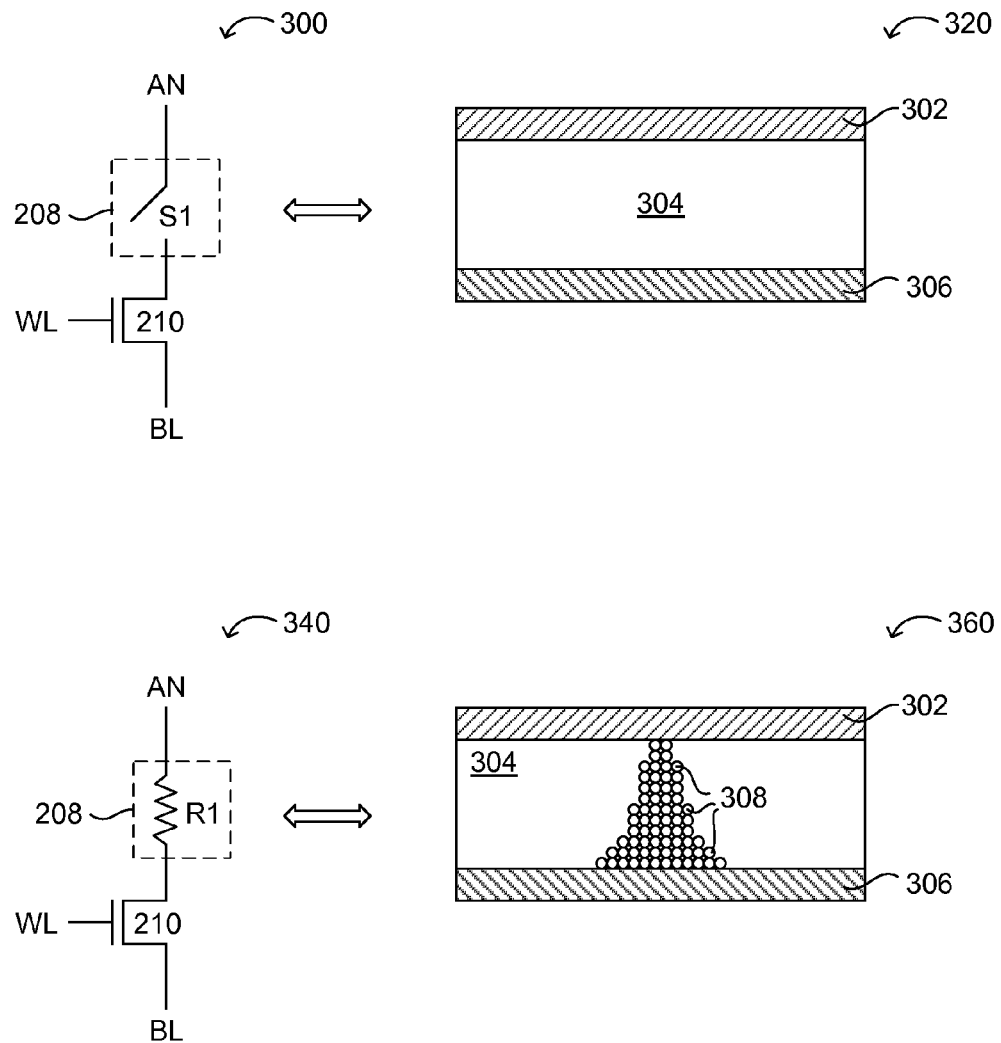
FIG. 3 is a diagram of an example programmable impedance element with schematic modeling.

Referring now to FIG. 3, shown is a diagram of an example programmable impedance element with schematic modeling. For example, example 300 shows a memory cell with an open switch S1 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example CBRAM Cell Sensing and Datapath Structure

Figure 4:
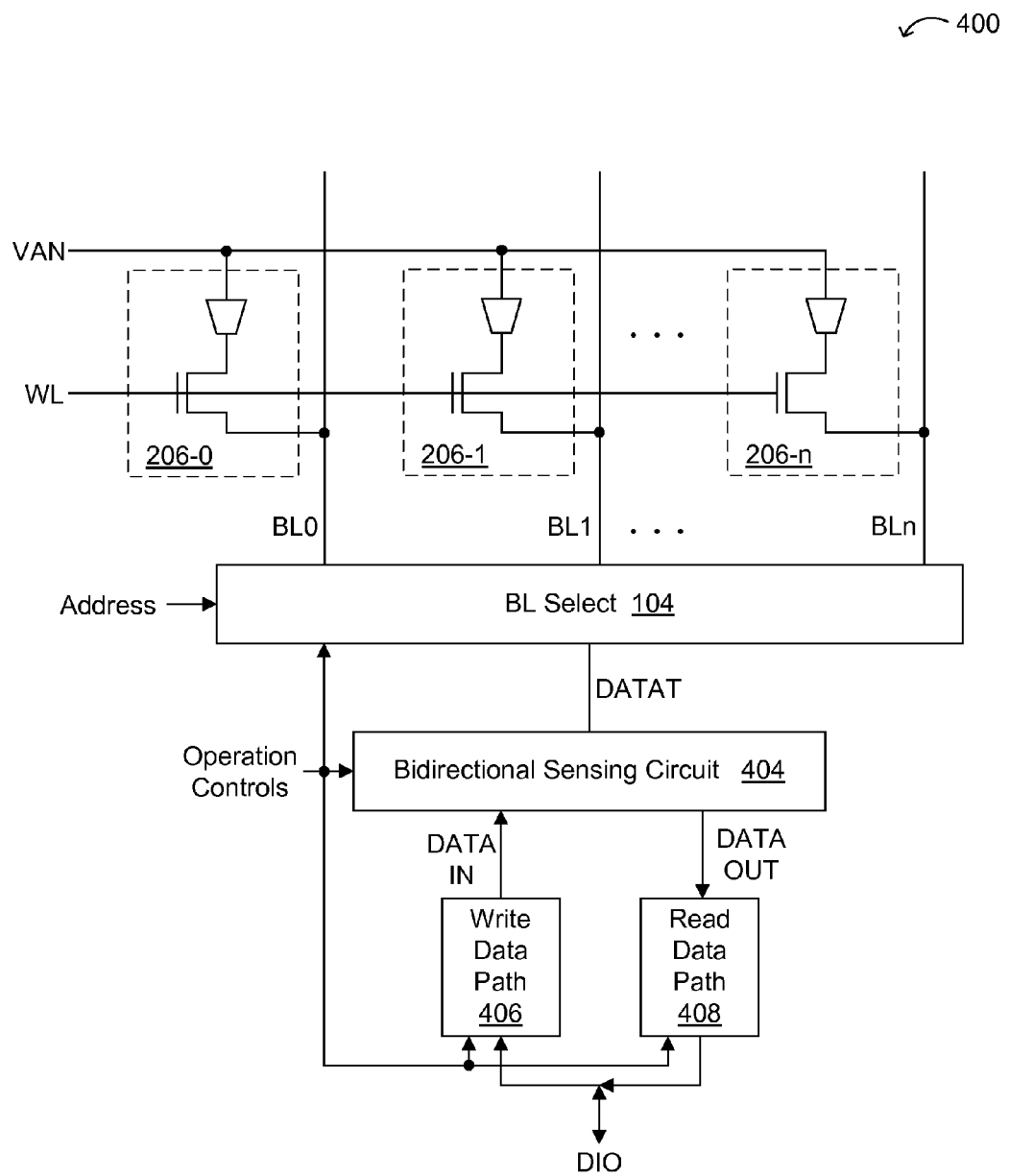
FIG. 4 is a schematic block diagram of an example bidirectional sensing data path arrangement in accordance with embodiments of the present invention.

Referring now to FIG. 4, shown is a schematic block diagram of an example bidirectional sensing data path arrangement 400, in accordance with embodiments of the present invention. In this example, memory cells 206-0, 206-1, . . . 206-n are shown. In some cases, a reference memory cell can also be included such that a resistance of a selected memory cell can be compared against that of the reference memory cell for read operations. It is understood, however, that other memory cells 206, word lines, and other components and arrangements, are also included. In this particular example, bit line select circuitry 104 can be controlled by address decoding, and may select one of bit lines BL0, BL1, . . . BLn for coupling to bidirectional sensing circuit 404 via DATAT.

Bidirectional sensing circuit 404 can also receive operation control signals. These signals can be used to control activation of read data path 408, write data path 406, and sensing circuitry in circuit 404, as appropriate for the given command. For example, read data path 408 may be activated for a read operation, a program verify operation, or an erase verify operation. Also, write data path 406 may be activated for a program or erase operation. In certain embodiments, common bidirectional sensing circuit 404 can be employed in each of these operations. In particular, bidirectional sensing circuit 404 can allow for a program verify to be performed using a same forward bias (anode voltage higher with respect to cathode voltage) on the memory cell as was used to program the memory cell. Similarly, bidirectional sensing circuit 404 can allow for an erase verify to be performed using a same reverse bias (cathode voltage higher with respect to anode voltage) on the memory cell as was used to erase the memory cell.

The majority of non-volatile memory (NVM) methodologies utilize predetermined program and erase verify levels. This can allow for the read margins to be increased even if there is drift in the program and erase resistance of the memory cell. In some approaches, the same read voltage levels may be maintained, and only the current may be changed. In particular embodiments, the same read or sensing circuit can be used to perform a regular read, as well as program/erase verify operations. Use of the same sensing circuitry for these operations can improve correlation therebetween.

Figure 5:
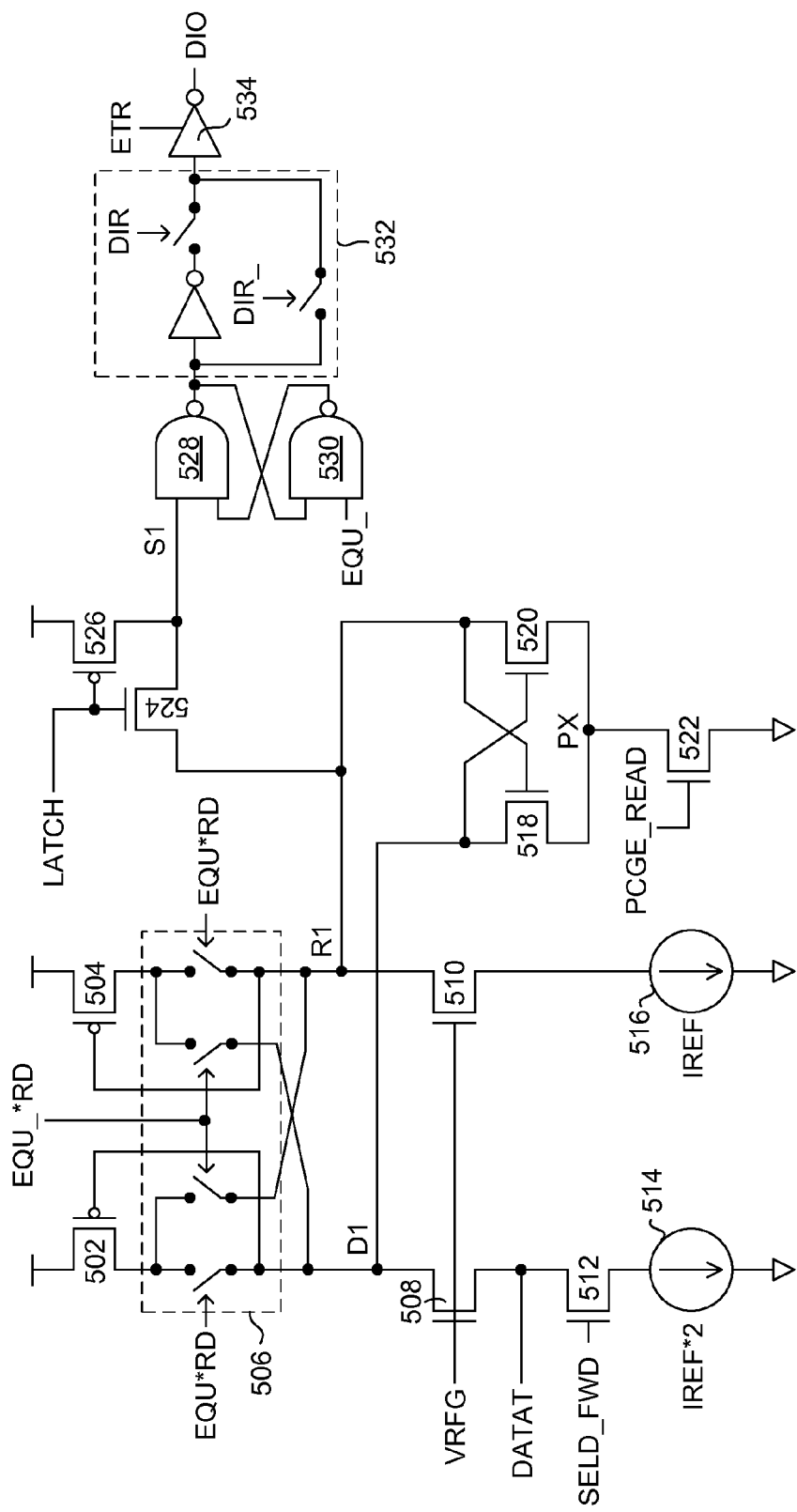
FIG. 5 is a schematic block diagram of an example bidirectional sensing circuit in accordance with embodiments of the present invention.

Referring now to FIG. 5, shown is a schematic block diagram of an example bidirectional sensing circuit 404 in accordance with embodiments of the present invention. This particular example utilizes a switchable current load and a cross-coupled PMOS load. PMOS transistors 502 and 504 can be diode-connected or cross-coupled depending upon the states of switches 506. NMOS transistors 508 and 510 can be controlled by a reference voltage VRFG, which may be equal to VREF+VGS(IREF). In one application, VRFG can be set globally on the resistive switching memory device. DATAT can be coupled to the memory cell accessed from the memory array.

NMOS transistor 512 can be controlled by direction indicator signal SELD_FWD, and may have its drain connected to DATAT, and its source connected to current source 514 to VSS. For example, current source 514 may be twice IREF, which can be IRF or IPR, and may be set globally on the resistive switching memory device. Similarly, current source 516 can be connected between a source of transistor 510, and VSS. For example, current source 516 may have a current of IREF. Also, direction indicator signal SELD_FWD can indicate whether the read is a forward bias read or a reverse bias read as to the anode and cathode of the programmable impedance element in the accessed memory cell.

Node D1 can connect to a drain of NMOS transistor 518, and a gate of NMOS transistor 520. Node R1 can connect to a drain of transistors 520, and a gate of transistor 518. The sources of transistors 518 and 520 can connect at node PX. Also, NMOS transistor 522 can be connected to node PX at its drain, to VSS at its source, and to control signal PCGE_READ in its gate. For example, control signal PCGE_READ can be used to speed up a read or sensing operation by sinking current at node PX. A latch control signal can connect to the gates of NMOS transistor 524 and PMOS transistor 526. Thus, when the latch control signal is high, the value on node R1 can be allowed to pass through via node S1 to the SR flip-flop formed by NAND-gates 528 and 530. In contrast, when the latch control signal is low, node R1 can be isolated from node S1, which can be pre-charged high via transistor 526.

The output read from sensing circuit 500 can be latched by way of the SR flip-flop, which can be reset when the equalization signal EQU is activated (EQU_ is low). For example, equalization signal EQU can allow for the PMOS transistor 502/504 load to be configured as diode-connected transistors at the start of a read operation, and to reset the latch structure including the SR flip-flop. The directionality of the output can be set to the proper polarity by direction control signal DIR and the inverter and switch structure 532. Thus, depending on whether the read was a forward bias read or a reverse bias read, direction control signal DIR and circuitry 532 can be used to provide the appropriate output at DIO via enabled inverter 534.

In particular embodiments, current and/or voltage polarity of the sense amplifier can be inverted for common cathode or bit line anode architectures. The sensing may also be performed with capacitive decay. In any event, margins can be improved by taking advantage of the nonlinear nature of the resistance of resistive memory cells (e.g., CBRAM cells) in order to improve program/erase verify levels. The program verify operation may have a reduced voltage as compared to conventional approaches to reduce resistance levels, and to limit exposure of the memory cell to verify voltages could otherwise cause disturb of the cell data. This may be done even if program/erase reinforcement by way of sensing for verify operations being in the same bias direction as the corresponding program/erase operations were not necessary.

Thus in particular embodiments, a program or erase operation on a resistive memory cell may have a follow-on verify operation that utilizes a read in a same bias direction in which the cell was programmed or erased. Thus, a program verify operation can employ a forward bias (anode with respect to cathode) read, while in erase verify can employ a reverse bias read. In this way, the anode voltage may not have to be switched as much as much as in other approaches, and the forward sensing can be used with a higher reference voltage to maintain a relatively low bias across the memory cell. In addition, reduced anode switching can result in substantial power savings for common anode architectures because the anode is essentially a large common plate with an associated high capacitance.

For erased memory cells, a nonlinear resistance of the memory cell may be seen, and thus a larger voltage may be utilized in the reverse direction to sense in order to verify the erase. In this way, a verify operation with larger currents for the larger resistances of the erased memory cell may be returned to a normal or lower bias for a standard read operation. This is in contrast to approaches that would always read the memory cell in one bias direction. Rather, sensing approaches as described herein can read a memory cell in both bias directions, or either direction based on the particular operation (e.g., program, erase) to verify. For example, to verify a program operation, a special forward read can be employed to verify the program with a higher voltage because the anode may already be at that high voltage from the previous program operation.

For an erase operation, the common anode may be at a ground level to perform the erase, which can be a reverse bias direction. Then, a larger voltage can be applied to the bit line coupled to the cathode to perform the erase verify operation. Thus, a relatively large current can be utilized to verify with as part of the verify operation. Further, that same or a similar current can be employed in a normal read with a lower voltage in the reverse direction to verify because current is exponentially reduced with lower voltage. Thus in some applications, it may be desirable to utilize larger currents in sensing circuitry because smaller currents may be susceptible to noise, and are typically more difficult to generate and to control. Further, the compact sensing circuitry of particular embodiments being applicable for both verify and read operations can save die size.

Figure 6:
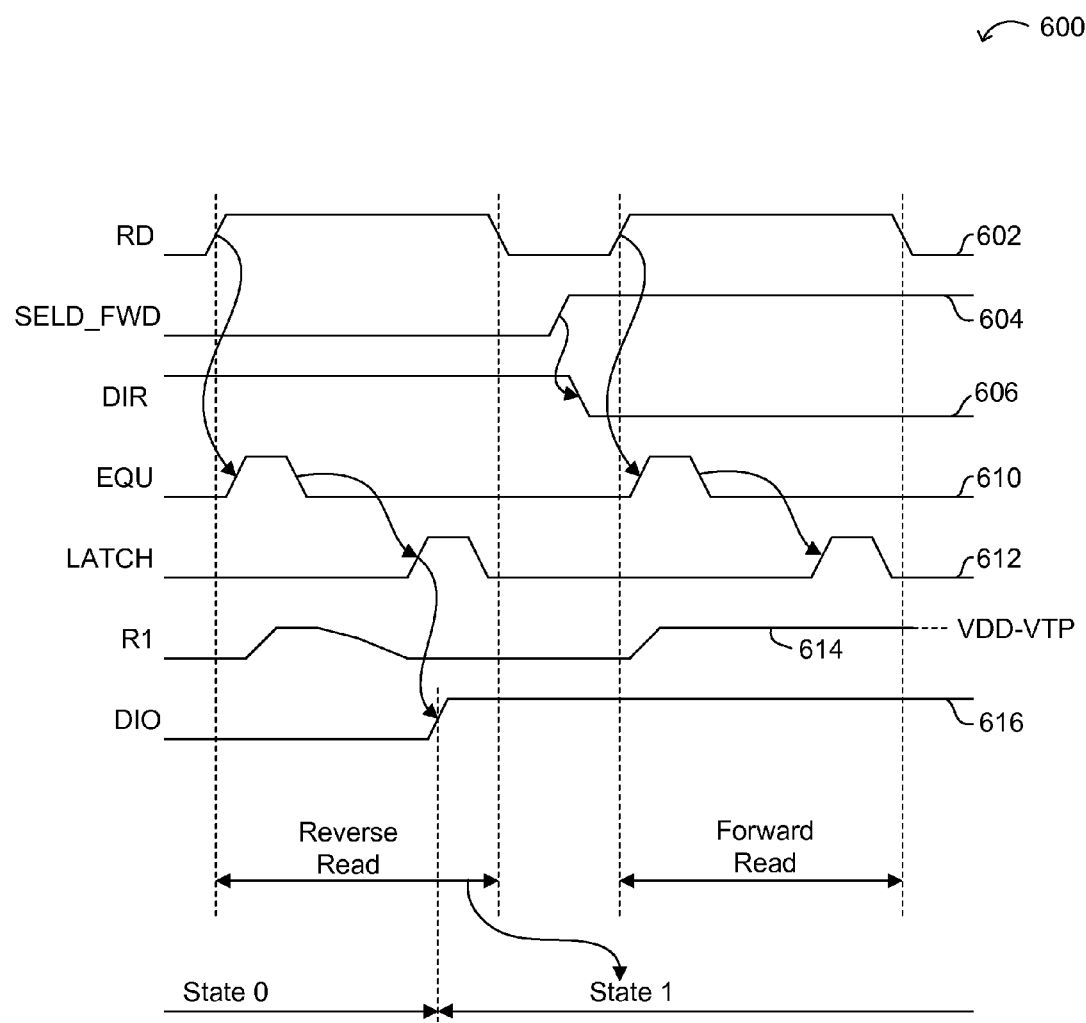
FIG. 6 is a waveform diagram of an example operation of the bidirectional sensing circuit of FIG. 5.

Referring now to FIG. 6, shown is a waveform diagram of an example operation 600 for the bidirectional sensing circuit shown in FIG. 5. In this particular example, the read control signal RD can go high to initiate a read operation, and two read operations are shown in waveform 602. Waveform 604 shows forward read control signal SELD_FWD, which can be low to indicate a reverse bias read, and may be high to indicate a forward bias read. Thus, the first read cycle in this example may be a reverse bias read, while the second read cycle may be a forward bias read. The direction indicator DIR can be high to indicate a reverse polarity, and low to indicate a forward polarity, as shown in waveform 606. Thus, the data can be inverted at DIO when DIR is high.

The equalization control signal EQU can be a high going pulse triggered off a rising edge of the read control signal RD. Thus, as shown in waveform 610, EQU may pulse high to provide a diode load (e.g., via PMOS transistors 502 and 504) at the start of the read cycle, and also to reset the data latch at the output of the sensing circuit. The latch control signal can be a high going pulse delayed from EQU. As shown in example waveform 612, the latch control signal may pulse a delay time away from a falling edge of EQU to allow time for signal development at node R1. As shown in example waveform 614, signal R1 can develop to a low level for the reverse read operation, and to a high level (e.g., VDD-VTP) for the forward read operation. Output signal DIO, as shown in waveform 616, may be low until the latch control signal allows an inversion of the developed signal at R1 to pass through to the latch, and may remain high for the subsequent forward read operation. The data latches may be reset at the end of each operation, and also at circuit power up.

Example Common Plate Switching Reduction Approaches

As discussed above, a common plate anode architecture may be employed in resistive switching memory devices. If the bias of the array is not at the low rail (VSS or 0V), the leakage of the access transistors, over time, can have degrading effects on the memory device performance. Also, in order to quickly read at power-up, the bias of the array during read may be with respect to the low rail (VSS or 0V). The common anode plate is usually rather large, and thus has a relatively large capacitance associated therewith. In addition, polarization capacitance, parasitic routing, and junction capacitances of the programmed cells, can contribute to the overall capacitance. The most energy and performance in this architecture may be apportioned to access the memory cell at the cathode or bit line with a positive voltage with respect to VSS. This puts a negative or reverse bias from anode to cathode across the memory cell during a read operation. Such a reverse bias can reinforce an erased cell, but can disturb a programmed cell. In contrast to the approach of particular embodiments, conventional read circuitry does not discriminate between program and erased cells, which can allow for program disturbs.

In the various modes of operation, such as program, erase, verify, and read, supported by a resistive switching memory device, the common plate voltages levels may be adjusted to be different for the given operating mode. Switching from one such voltage level to another requires energy, may have associated cell disturb concerns, and can also take up valuable cycle (e.g., program or erase cycle) time. Typical program or erase algorithms can switch common plate voltage levels multiple times as the operation moves from a write operation to a corresponding verify operation, and vice versa. Therefore, it is desirable to minimize the switching of the voltage level of the common plates. In this way, power and write cycle times can be reduced.

Figure 7:
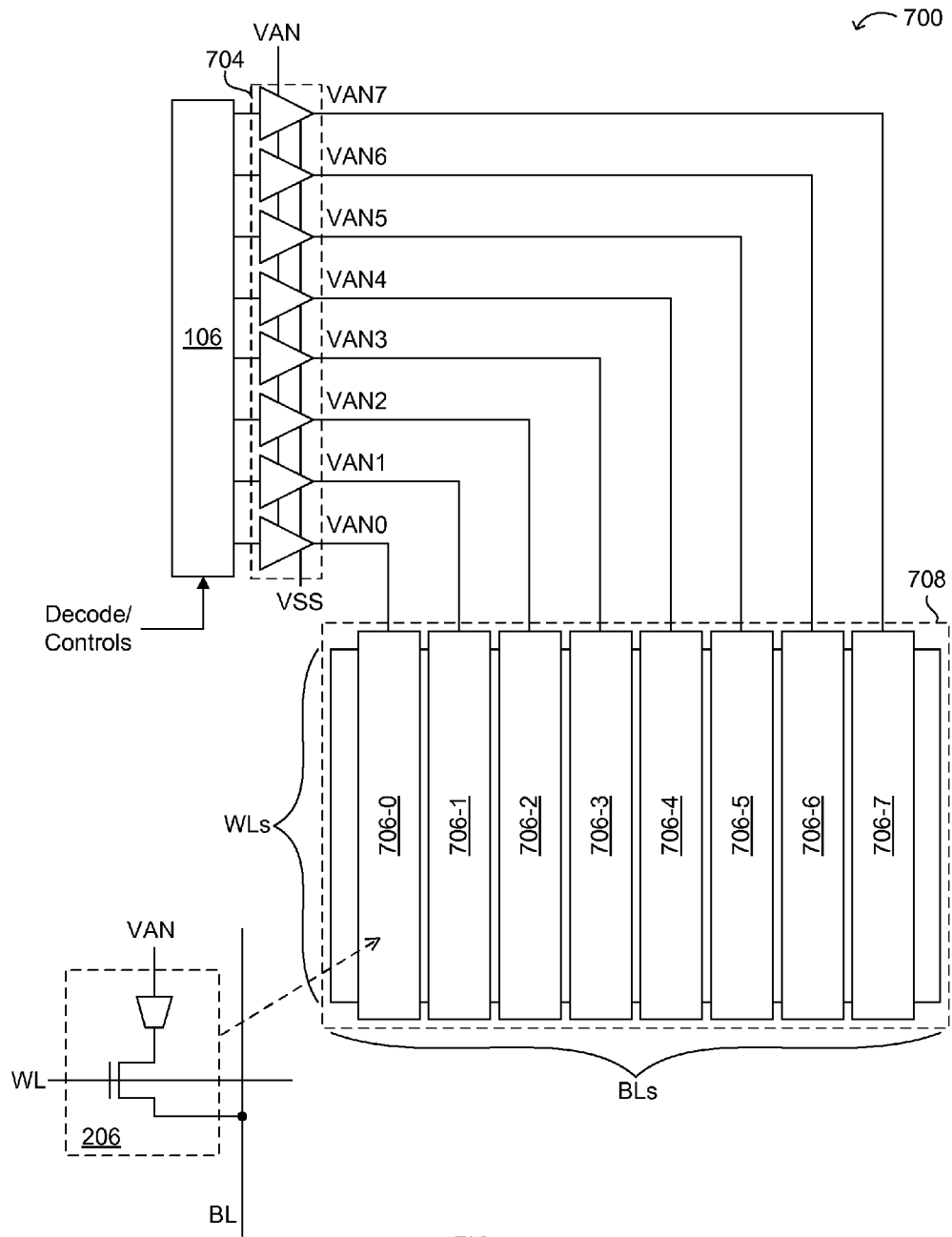
FIG. 7 is a schematic block diagram of an example common anode plate arrangement in accordance with embodiments of the present invention.

Referring now to FIG. 7, shown is a schematic block diagram 700 of an example common anode plate arrangement in accordance with embodiments of the present invention. Various combinations of common plates and associated control and drivers are supported in certain embodiments. In the particular example of FIG. 7, shown are 8 common anode plates (e.g., 706-0, 706-1, . . . 706-7) in a memory array or memory array portion 708. However, other numbers (e.g., 4, 16, etc.) of anode plates and/or anode voltage level drivers can also be accommodated. Also, each common anode plate 706 can be independently controlled based on the particular operation. The independent control can include switching between a given VAN level or VSS based on control of driver block 704 from control block or common anode select circuitry 106, as well as control of the level of VAN as supplied to driver block 704. An adjustable anode voltage VAN can be supplied to driver block 704, which can be controlled by control block 106. For example, based on address decoding and operation control (e.g., program, erase, read/verify, etc.) signals, VAN can be adjusted, and VAN or VSS can be supplied to one or more of VAN0, VAN1, . . . VAN7, in order to power the corresponding anode plate.

As shown, memory array 708 can include word lines (WLs) running horizontally, and bit lines (BLs) running vertically. It is understood that variations in the vertical and horizontal directions as shown may change as the product is rotated; however, word lines may remain substantially perpendicular to the bit lines in routing through memory array portion 708. Common anode plates 706 can be connected to anodes (see, e.g., VAN connection in resistive memory cell 206) within the associated memory array subset. Depending on the process technology and architecture used, anode plates 706 may be formed of an active anode metal, and may be strapped with an upper-level metal (e.g., metal-2, metal-3, etc.) that covers a subset of memory array 708. In this particular example, common anode plates 706 can be organized according to or along vertical bit lines. Thus, a number of bit lines may be connected to resistive memory cells that have anode connections to a given common anode plate 706. For example, the number of bit lines within a plate can be N, where N is a positive integer (e.g., 8, 16, 32, etc.). Further, N may be optimized for power and performance, based on the particular application and technology considerations. Thus, N can be representative of a number of bit lines corresponding to a common anode plate 706, and may form a subset of memory array 708.

Depending on the particular operation, voltages on a selected common anode plate (VAN) and a selected bit line (VBL) can be adjusted. Examples of such voltages are shown below in Table 1. Of course, other voltage levels or combinations of levels can be accommodated in certain embodiments.

TABLE 1

| Operation | VAN | VBL |
| --- | --- | --- |
| Program | 2 V | 0 V |
| Read | 0 | 200 mV |
| Erase | 0 | 1.4 V |
| Program Verify | 0 | 200 mV |
| Erase Verify | 0 | 200 mV |

Margin for read and verify operations can be built-in by changing the reference current against which a selected memory cell current may be compared. To execute a program command, a program verify operation may be performed prior to a corresponding program operation in order to determine if a particular storage bit is already in the desired state. If not, one or more program pulses can be provided as part of a program operation, and a check can be performed to determine if an allowable number attempts is equal to the maximum. A similar algorithm can be employed for erase operations. For example, in cycling between program and associated program verify operations, the anode plate may be switched from about 2V to about 0V, and then back again to about 2V. In addition, unselected bit lines under the same anode plate may be charged up to about 2V during program operations in order to reduce cell disturb for resistive memory cells coupled to a selected word line. Of course, other voltage levels can also be employed, but in this case the program/erase algorithm may require multiple switching of a common anode plate and/or bit lines under the same anode plate.

The energy to actually change a data state of a selected memory cell can be relatively small, but energy associated with the common anode plate, as well as the bit lines under the common plate, can be relatively large. In one example architecture, the capacitance of a common anode plate may be about 350 fF, and each bit line may have a capacitance of about 250 fF. In this case, a total capacitance that may need to be charged/discharged to execute program/erase commands (e.g., to change and/or verify cell data states) can be about 2 pF. Due to the energy ($P=CV^2$) associated with such charging and discharging such capacitances, it is desirable to minimize plate and bit line switching.

In one embodiment, a method of controlling a resistive switching memory device having a plurality of resistive memory cells arranged as subsets corresponding to common plates, can include: (i) detecting a write command to be executed as first and second write operations on the resistive switching memory device, where each of the resistive memory cells is programmable to a low resistance state by application of a first voltage in a forward bias direction, and erasable to a high resistance state by application of a second voltage in a reverse bias direction; (ii) performing the first write operation on each resistive memory cell in a selected subset of the plurality of resistive memory cells having a common plate connected thereto; and (iii) performing the second write operation on at least one of the resistive memory cells in the selected subset based on the detected write command.

In one embodiment, a resistive switching memory device can include: (i) a plurality of resistive memory cells, where each of the resistive memory cells is configured to be programmed to a low resistance state by application of a first voltage in a forward bias direction, and to be erased to a high resistance state by application of a second voltage in a reverse bias direction; (ii) a plurality of common plates, where each of the common plates is connected to a subset of the plurality of resistive memory cells; (iii) a command detector configured to detect a write command that is to be executed on the resistive switching memory device as a first write operation followed by a second write operation; and (iv) a write controller configured to perform the first write operation on each resistive memory cell in a selected of the subsets of resistive memory cells, and to perform the second write operation on at least one of the resistive memory cells in the selected subset based on the detected write command.

For example, the common plates can include common anode plates or common cathode plates, depending on the particular architecture. Also, the write controller can include control circuitry that can control execution of one or more write operations as part of a program or erase algorithm. In addition, a "subset" of resistive memory cells connected to a common plate can include a sub-block of all resistive memory cells connected to a given common plate, all resistive memory cells along a given word line and connected to the common plate, or all resistive memory cells along a given bit line and connected to the common plate. In any event, the subset of resistive memory cells includes memory cells connected to a same common (anode or cathode) plate. In addition, as used herein, a "write operation" can include either of a program/ erase operation (e.g., voltage pulses designated to attempt to change a memory cell data state) and a corresponding verify operation (e.g., a read operation to determine if the memory cell is in the desired data state).

In one example, a write verify operation can be performed at a same common plate voltage as the associated write operation, where that voltage may be different from that of a typical read operation. In this case, a bidirectional sensing circuit 404 (e.g., as shown in FIG. 5) can be employed in order to allow for both forward and reverse bias direction reads. Sensing can be performed by forcing a predetermined voltage across a selected resistive memory cell, and measuring current at a read voltage, a program voltage, or at other predetermined voltages. Alternatively, capacitive sensing (e.g., with capacitive decay) can also be employed in order to read a memory cell data state. Further, automatic verify operations can be performed based on current and/or capacitance discharge.

In particular embodiments, use of bidirectional sensing circuitry and other architectural arrangements can allow for alternative voltages to be applied on the anode plate in the bit lines for various operations. Such alternative voltages, as compared to those discussed above with reference to Table 1, may allow for power savings for switching anode plates and bit lines, such as during execution of program/erase commands. Examples of such voltages are shown below in Table 2.

TABLE 2

| Operation | VAN | VBL |
|---|---|---|
| Program | 2 V | 0 V |
| Read | 0 | 200 mV |
| Erase | 0 | 1.4 V |
| Program Verify | 2 V | 1.5 |
|  | 1.5 V | 1.3 V |
|  | 2 V | 1 V |
| Erase Verify | 0 | 1.4 V |
|  | 0 | 1 V |

As shown in the example voltages levels of Table 2, the verify operations may have a same or smaller bias (VAN to VBL) across the memory cell, as compared to the corresponding program/erase operations. In some cases, it may not be possible to read a resistive memory cell under the exact same conditions or voltage levels under which cells are written due to possible nonlinearity and concerns of sufficient voltage across the cell for an erased cell, as well as possibly too much conductivity for a programmed cell that may swamp out or override the sensing circuitry. However, if the anode voltage is, e.g., about 1.5V for a read/verify operation, this may be more compliant with the program voltage (e.g., about 2V), and may result in power savings by not having to move the anode voltage level as much as in other approaches.

Also, a corresponding bit line voltage can be increased for the program verify operation (e.g., from about 0V to about 1V, about 1.3V, or about 1.5V), or may remain at about 0V in some cases, relative to the corresponding program voltage. For erase verify, a corresponding bit line voltage can be decreased (e.g., from about 1.4V to about 1V), or may remain at about 1.4V, relative to the corresponding erase voltage. In any event, common plate and/or bit line voltages may remain the same, or relatively close to the same (e.g., within about 500 mV, or within about 1V, etc.), and in the same bias direction or polarity, for the verify operations as compared to the corresponding program/erase operations. Because $P=CV^2$, relatively large differences in power consumption can be seen by swinging common anode plate and bit line levels by smaller relative voltages.

Thus, energy can be reduced when the program verify operation is performed in the same polarity, and as much as in the same program voltage levels (for common anode plate and bit lines) as feasible. Similarly, energy can be saved when the erase verify operation is performed in the same polarity, and substantially in the same, or relatively close to the same, erase voltage levels for common anode plate and bit lines. As discussed above, bidirectional sensing circuitry can be employed to accommodate same polarity operations for program verify versus program operations (both in a forward bias direction), and erase verify versus erase operations (both in a reverse bias direction). For erase operations, due to relatively low conductivity in an erased memory cell, more read margin can be obtained if the cell is read at a relatively high voltage. In this way, a same polarity with "minimized" voltage changes on VAN (e.g., such that the voltage change is less than about 500 mV) and/or bit lines in cycling between program/erase and associated verify operations can be utilized to reduce energy consumption.

In particular embodiments, different numbers of common plates 706 can be activated in a given cycle, based on decode/controls provided to block 106. For example, 1 of 8, 2 of 8, 4 of 8, etc., or various combinations thereof, of common plates 706 can be activated in a given cycle. Thus, different "subsets" could be activated with, e.g., corresponding numbers of plates being high instead of just a one plate at a time, such as for program and associated verify operations. Also, any type of possible controls and memory array 708 partitioning into subsets (e.g., all memory cells under a plate, groups of cells along a word line under the plate, groups of cells along a bit line under the plate, etc.) can be accommodated in particular embodiments.

Further, latches, flip-flops, or other storage circuitry can be employed in order to store intermediate or other results, such as from a verify operation, in order to accommodate power reduction improvements as discussed herein. For example, a program/erase operation or its corresponding verify operation, can be performed on an entire subset (e.g., common anode plate) of memory array portion 708, while the corresponding verify or program/erase operation can be performed on selected memory cells within that selected subset. In this way, voltage transitions on the common anode plate and associated bit lines may be reduced for program/verify and erase/verify cycling algorithms.

Figure 8:
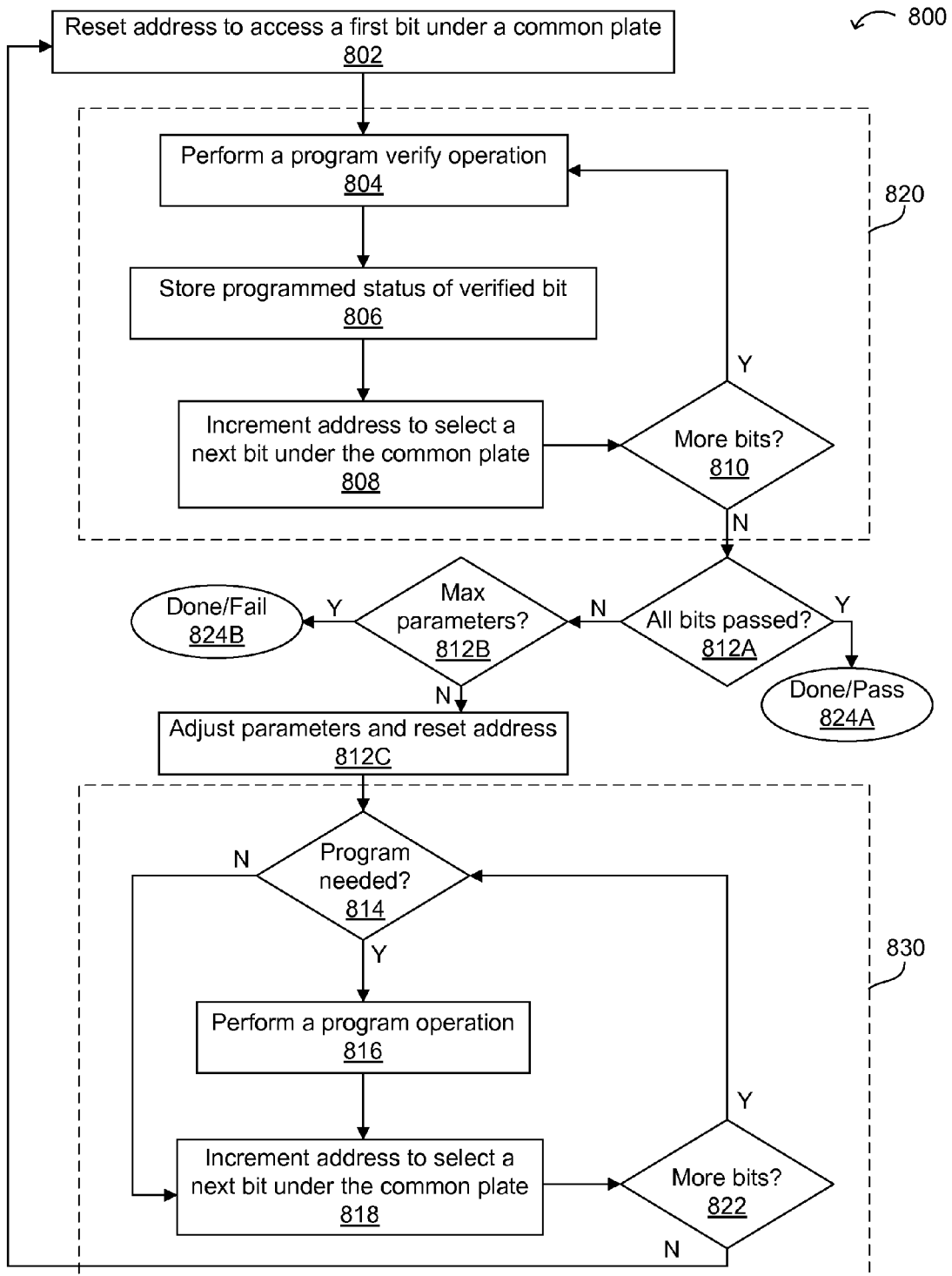
FIG. 8 is a flow diagram of an example operation of a resistive switching memory device in accordance with embodiments of the present invention.

Referring now to FIG. 8, shown is a flow diagram 800 of an example operation of a resistive switching memory device in accordance with embodiments of the present invention. In this particular example, execution of a program command on a resistive switching memory device is shown, where the program verify operation can generally occur prior to the associated program operation. Of course, particular embodiments also support a program verify operation occurring after its associated program operation. Further, a similar algorithm can be employed to execute an erase command, and erase operation ordering relative to associated erase verify operations can also similarly be as shown or reversed.

In this particular example, at 802, an address can be reset to access a first bit or storage cell under a common plate. The address can include both word line and bit line selection under a common plate 706. At 804, a program verify operation can be performed on the selected memory cell. At 806, the programmed status or data state of the selected resistive memory cell can be stored (e.g., in a register or latch, as will be discussed in more detail below with reference to FIG. 9). At 808, the address can be incremented in order to select a next bit or memory cell under the same common plate. If more bits remain to be accessed under the common plate at 810, the flow can return to perform a program verify operation at 804. However, if each bit under the common plate has undergone a program verify operation, a determination at 812A can be made as to whether all bits have passed.

If all bits under the common plate have passed at 812A to indicate that no further programming is needed, the flow can complete at 824A. For example, a flag or other pass indication can be supplied at 824A. However, if not all bits have passed at 812A, a determination as to whether parameters have been maximized can be made at 812B. Such parameters can include program voltages, currents, number of pulses, or number of program attempts. If such parameters have been maximized or exhausted, the flow can complete at 824B. For example, a flag or other fail indication can be supplied at 824B. However, if one or more operation parameters (e.g., voltages, currents, number of pulses, number of attempts, etc.) have not been maximized yet, such parameters may be adjusted (e.g., according to a program algorithm) and an address can be reset to access a first bit or storage cell under the common plate at 812C.

If the particular resistive memory cell is determined to be programmed (e.g., by prior program operation) at 814, the address can be incremented at 818. However, if the particular resistive memory cell has been determined at 814 to not have been programmed (e.g., the data state is detected as "1" and the desired data state is "0"), a program operation can be performed at 816. After the program operation at 816, the address can be incremented to select the next bit or memory cell under the common plate at 818. If more bits remain to be accessed under the common plate at 822, the flow can return to determine if a program operation is needed at 814. However, if each bit under the common plate has undergone a program operation, the flow can return to reset an address and access a different common plate at 802.

In this way, each memory cell under a selected common plate can undergo a program verify operation in portion 820, and then memory cells that need programming (e.g., to change a data state to "0") can be selectively programmed in portion 830. As discussed above, similar operations can be performed for erase operations. In each case, the switching of the common anode plate can be reduced, as compared to conventional approaches. Also, the order of the write operations (e.g., program or erase operations) versus corresponding verify operations can be reversed in some cases.

In particular embodiments, one of portions 820 or 830 can be applied to each resistive memory cell having a common anode plate 706. In this case, a remaining of portions 820 and 830 can be applied to a selected one or more resistive memory cells having a common anode plate 706. That is, a subset of resistive memory cells having a common anode plate can all be program verified prior to selectively programming any of the memory cells in that subset that need programming and are selected for programming by a program command and address decoding. In some cases, each of the memory cells in the subset may be considered for programming based on results of the corresponding verify operations. In other cases, only a designated number of memory cells in the subset may be considered for possible programming, again subject to corresponding verify operational results.

For example, each resistive memory cell under or associated with common anode plate 706-2 can undergo a program verify operation as included in portion 820. In this fashion, VAN2 can remain at a program verify voltage level (e.g., 1.5V, 2V, etc.) for each such program verify operation for each resistive memory cell 206 in that selected subset. Also, word lines and bit lines can be cycled through in order to provide coverage for the full subset under common anode plate 706-2. Alternatively, such a flow can apply to a single word line activation, such as for a given write command execution. In this case, a "subset" of resistive memory cells may be those cells having a common word line and a common anode plate 706.

Typically, a page of data or some number of data words may be programmed at a time, or as part of execution of a write command. In one example, when programming a 16B page of data, bits from adjacent bytes in the data page may be found on adjacent bit lines under the same anode plate. In particular embodiments, a program/erase algorithm may provide a program/erase pulse to all resistive memory cells that are part of the data portion to be written into memory array 708. In one case, a program verify can be performed on all bits or memory cells under the selected common plate, followed by a subsequent operation or operations to program all bits or memory cells requiring programming (e.g., based on the program verify results) under that same selected common plate.

As discussed above, when a particular algorithm cycles between program and associated verify operations, energy savings can be found by minimizing the charge that has to be supplied to or discharged from common anode plates and/or associated bit lines as part of this cycling. Further, either of portions 820 or 830 can be applied to all such writes for a selected plate. For example, within a selected plate, all writes (e.g., portion 830) may be performed before corresponding verify operations (e.g., portion 820). In this way, there may be voltage level transitions on anode plates and bit lines in going from the plate-based write or verify to the more designated (e.g., per memory cell or word) verify or write operations. Thus, instead of operating on a word-by-word basis, the resistive switching memory device may be operated on a plate-by-plate basis in particular embodiments. Also, registers (e.g., latches or flip-flops) can be included to temporarily store verify results such that a bit-wise verify can be performed. Alternatively, all verify operations (e.g., portion 820) can be performed before corresponding write operations (e.g., portion 830), whereby it may be determined (e.g., via latched data) which bits need to be written in order to change appropriate data states.

Figure 9:
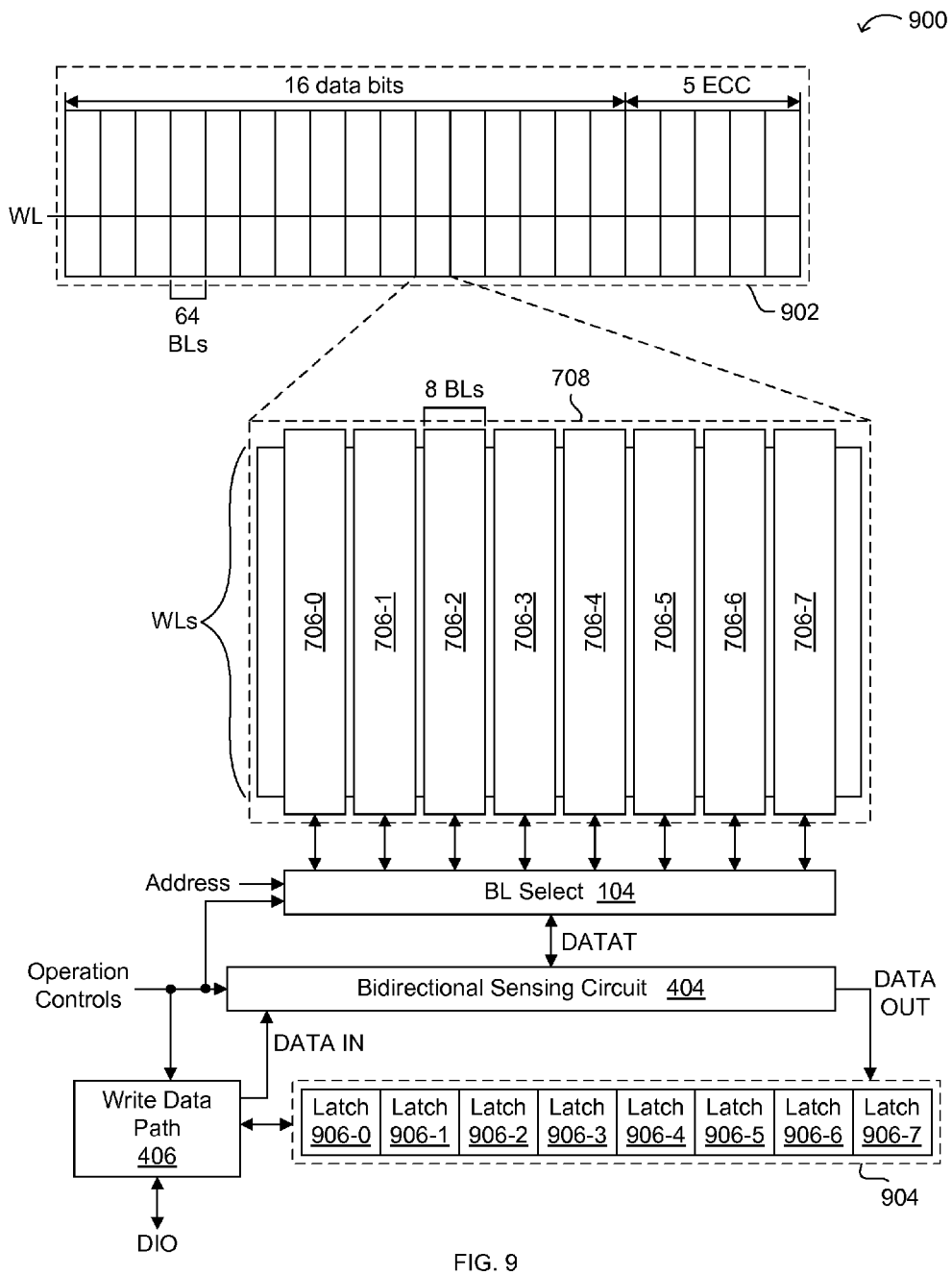
FIG. 9 is a schematic block diagram of an example detection data path and array architecture in accordance with embodiments of the present invention.

Referring now to FIG. 9, shown is a schematic block diagram 900 of example detection data path and array architecture in accordance with embodiments of the present invention. In one very particular example, memory array 902 can include array portions allocated for a data word that includes 16 data bits plus 5 error-correcting code (ECC) bits. In this way, memory array 902 can be broken up into 21 sections. Each section can map to memory array portion 708 that can include 64 bit lines. Also, 8 bit lines can be grouped per plate, and the 64 bit lines of memory array portion 708 can make up one I/O. Of course, the structure shown in 900 represents only one architecture example, and any suitable architecture and data path structure can be accommodated in particular embodiments.

As shown, each I/O mapping to 64 bit lines can share a sense amplifier (e.g., bidirectional sensing circuit 404) and data register 904. For example, data register 904 can include 8 data latches 906 (e.g., 906-0, 906-1, . . . 906-7). In one example, 906 can be accessed in a serial fashion to store data output (e.g., one bit at a time) from bidirectional sensing circuit 404. A page of data can map across memory array 902, with a common word line. Also, there may be 168 (8*21) anode plates 706 across memory array 902. As part of a memory operation (e.g., program, erase, verify, etc.), 21 plates may be activated corresponding to each I/O. To program a next bit position, a next set of common anode plates (e.g., from 706-0 for bit position 0 to plate 706-1 for bit position 1, etc.) would be selected. Thus, in order to store an entire page of data, all 168 anode plates would need to be cycled through in this particular configuration.

In particular embodiments, data registers 904 can be used to store data or information related to storage bits under each plate 706. Various data storage options can be supported in particular embodiments. For example, latch 906-1 can be used to store verify operation results corresponding to an accessed resistive memory cell under common anode plate 706-1. Similarly, latch 906-4 can be used to store verify operation results corresponding to an accessed resistive memory cell under common anode plate 706-4. Alternatively, each latch 906 in registers 904 can store verify operation or data state results related to the corresponding eight bit lines under a selected plate 706 and a given word line. That is, sensing circuit 404 can serially output sensed data states for a selected word line and common anode plate, as cycled through the eight bit lines via BL select 104.

Particular embodiments also support additional registers 904 and/or additional sensing circuits 404 to provide more parallelism, such as by reading each bit lines under a selected anode plate in a parallel fashion. In any event, resistive memory cells can be read to determine a stored data state for verify purposes, and the result (e.g., whether there is a 0 or 1 value stored in the cell) can be stored in an appropriate latch 906. For a subsequent program/erase operation (e.g., portion 830), corresponding latch 906 can be accessed to determine if a particular program or erase operation is needed on a bit-by-bit basis. Also, the selected plate can remain activated with a possibly adjusted voltage level (e.g., by about 500 mV) during this time, further reducing power.

Other architectures, and specifically anode plate arrangements relative to being along word lines or bit lines, can also be accommodated in particular embodiments. In addition, data page allocations in relation with such anode plate arrangements can be utilized to further reduce power consumption in particular embodiments. Thus, power reduction techniques and structures in particular embodiments can include write algorithm improvements with respect to common anode plates, as well as anode plate arrangements and allocations with respect to data words or pages to be stored in the memory array.

Figure 10:
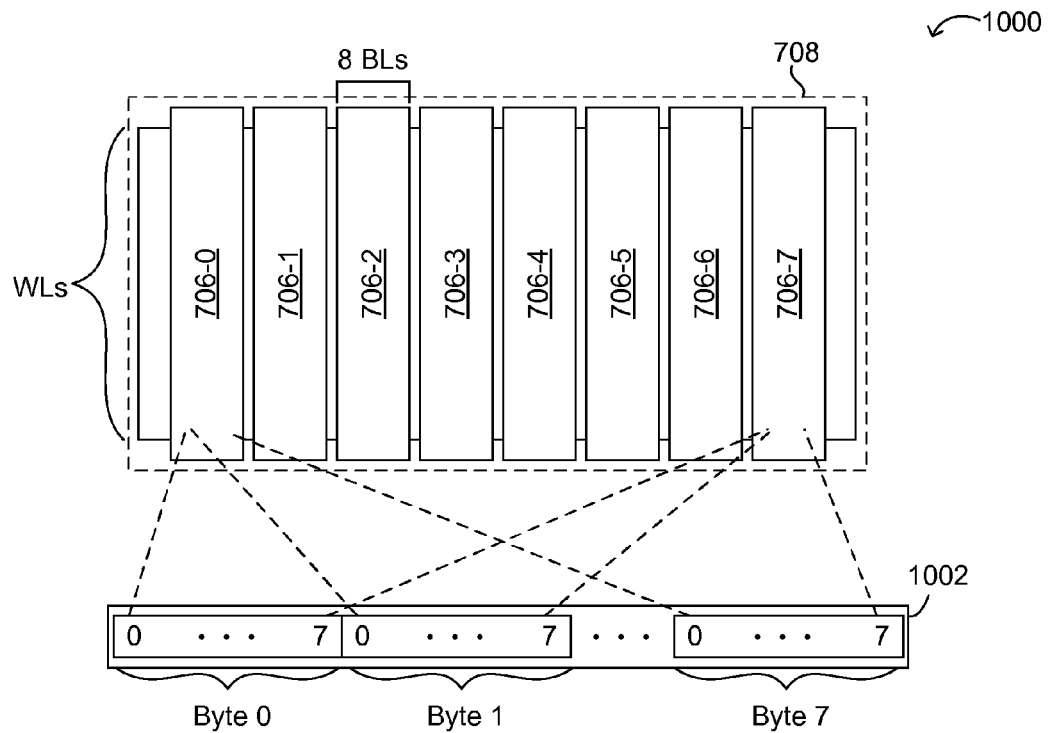
FIG. 10 shows example data page organization for common plates in accordance with embodiments of the present invention.
Figure 10:
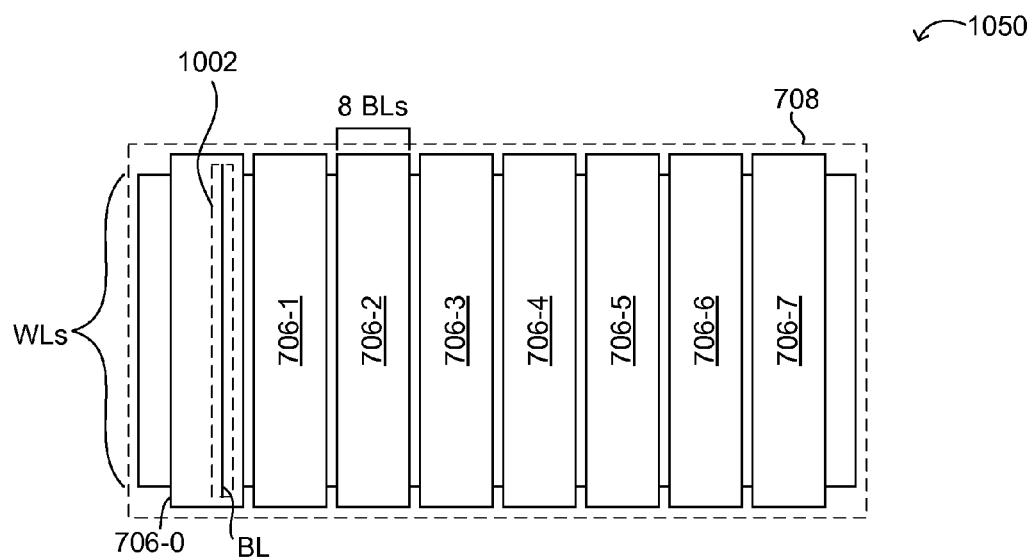

Referring now to FIG. 10, shown is example data page organization for common plates in accordance with embodiments of the present invention. As shown in example 1000, data word 1002 can include a number of bytes (e.g., bytes 0-7). In some cases, data word 1002 can represent a full "page" of data, while in other cases data word 1002 may be a portion of a data page. Also, a mapping of bit positions in each byte can be as shown, where a least significant bit position in each byte is mapped to an adjacent bit line in common anode plate 706-0 subset. Other bit positions can map accordingly, such as a most significant bit position in each byte mapping to an adjacent bit line in common anode plate 706-7 subset. In this configuration, each of common anode plates 706 may need to be exercised in order to perform an operation for an entire page of data.

In another arrangement, the data can be stored along columns, where each anode plate can map to a corresponding I/O. Alternatively, data may be serialized from a parallel set of I/Os, and multiple I/Os may be mapped to a single anode plates. In any event, a page of data can be organized in a serial device as a vertical bit line of storage bits, versus a word line of storage bits. This can enable all of the bits in a data page to share one common plate 706. An example of such a structure is shown in 1050, where a bit line (BL) can accommodate a page of data 1002. In this configuration, only one plate 706 may need to be accessed per I/O. Thus, instead of 168 plates being exercised in order to access a page of data, only 21 (e.g., one per I/O) may need to be accessed, for a possible eightfold improvement. However, the word lines do need to be switched more frequently in order to access each resistive memory cell for a page of data. Because the word line itself may have a capacitance of about 1 pF, the improvement may not be realized as a full eightfold gain. In other alternative configurations, a shorter word line (e.g., mapped to 32 bit lines instead of 64 bit lines) can be utilized to reduce the word line capacitance, with a page of data being stored in memory cells along two separate bit lines.

In some cases, instead of word lines having to cycle for each operation to accommodate a page of data, the word lines can be held in an activated state across multiple operations. In these example cases, a word line may remain high in between a program operation and a program verify operation. In other cases, the word lines may be cycled through to span a full anode plate in order to access storage bits in a page of data, such as in the arrangement of example 1050. In any event, word line capacitance may typically be less than a sum of the capacitances on a common anode plate and a bit line. Thus, cycling of word lines to access a page of data may be preferable in terms of power usage to cycling or otherwise adjusting common anode plates and or bit lines.

Figure 11:
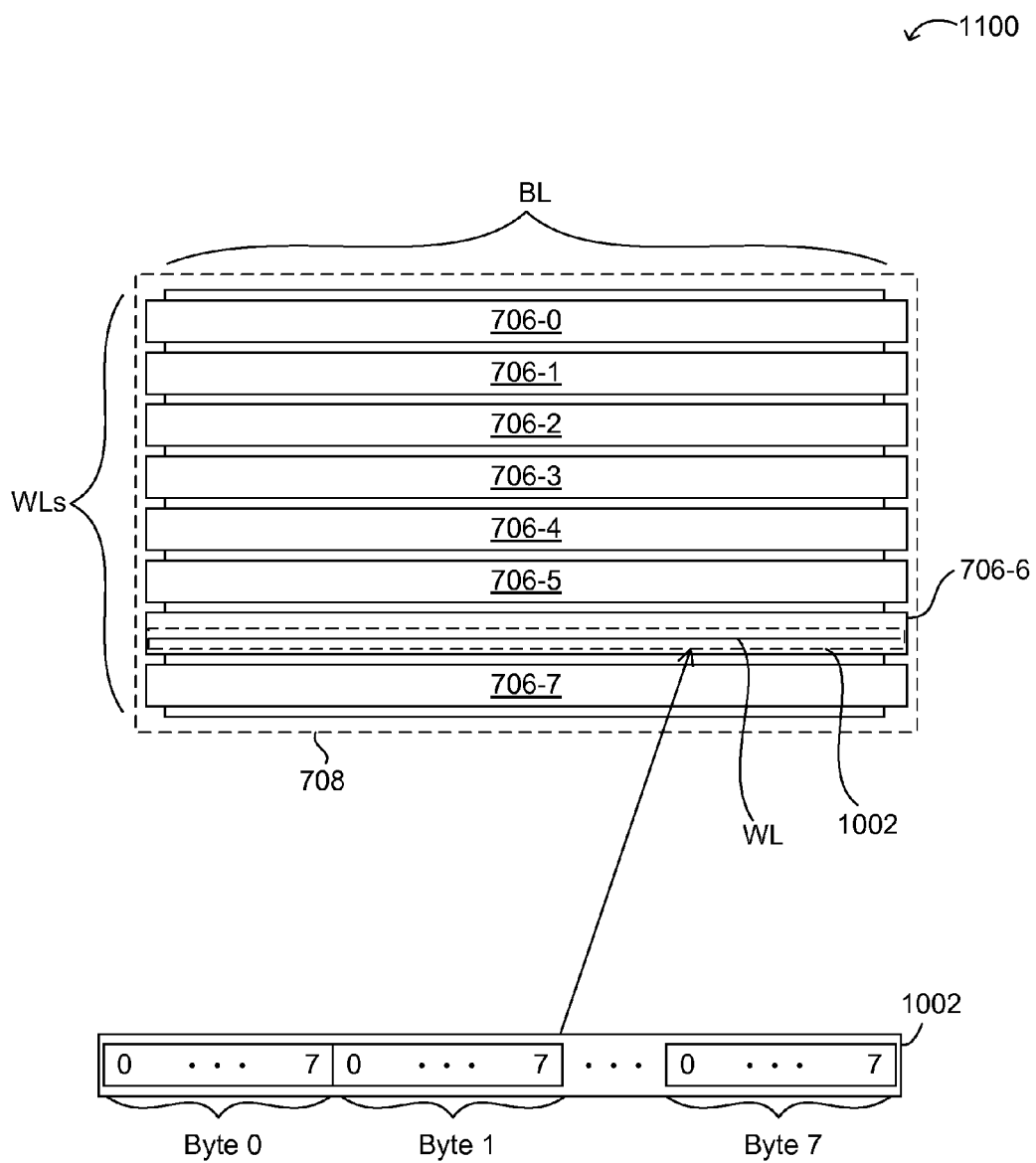
FIG. 11 shows example word line based data page and common plate organization in accordance with embodiments of the present invention.

Referring now to FIG. 11, shown are example word line based data page and common plate organization, in accordance with embodiments of the present invention. In this example 1100, common plates 706 can be arranged horizontally such that all of a page of data may share one common plate. For example, such a common plate can be arranged along a word line. In one example, each of the common plates may be connected to a memory cell subset along n-word lines, where n is a positive integer (e.g., from 1 to 32). This can be coupled with high parallelism on the program operation in order to avoid a number of bit lines switching unnecessarily. Further, this arrangement can also be utilized with NAND-style writes and/or global program and bit-wise erase operations.

In arranging common anode plates to be in a same orientation as the word line, potential disturb issues may arise. For a selected anode and word line, but an unselected bit line, for a given resistive memory cell, that bit line may also go to a same level as the anode plate (e.g., about 2V) in order to not disturb that de-selected memory cell during programming of a selected memory cell. Thus, many or in some cases all bit lines in memory array portion 708 may need to be raised to the same high level (e.g., about 2V), resulting in increased power consumption. However, if an entire page is to be programmed, all such bit lines can be maintained at a predetermined level (e.g., about 0V) without switching. Further, if VAN can remain up (or substantially at a same level as during a program operation, such as within about 500 mV) during program verify, resulting in only bit lines being switched (e.g., increased by about 500 mV, 1V, etc.), power savings can accordingly be improved.

In typical electrically erasable programmable read-only memory (EEPROM) applications, writes can occur on per-word basis. In the arrangement 1100, only one common anode plate 706 need be activated for a full page 1002 of data. In EEPROM applications, the concept of a write (a program or erase as one command) occurs on a word or byte basis. In contrast, Flash EEPROM includes a block erase (or sector or page), and a program can be on that block basis.

In a NAND Flash type of memory, typically substantial serial data (e.g., a universal serial bus [USB], digital camera card, etc.) may be written, and this may be particularly suitable for example configuration 1100. In addition, global program and bit-wise erase operations can be employed in applications where program of an entire page is commonplace. In typical Flash applications, a global clear of data (erase) of a memory block occurs, followed by randomly writing or programming selected data. In particular embodiments, a global program can occur, followed by a selective erase of certain bits. For external pin compatibility, program and erase commands versus expected data as stored can be reversed in some applications. In addition, individual erase may benefit from VAN being at ground, so erase/erase verify can be performed without having to switch the common anode plate.

Resistive switching memory cells as discussed herein may also each support more than one memory state. In addition, depending on the voltage level controls, instead of a full erase or a full program/write, partial operations (e.g., by applying less/predetermined voltages for forward bias and reverse bias of the CBRAM cell, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of CBRAM cell on resistances can be converted into 3-bit storage values. Thus in this example, eight different data values can be stored in a given CBRAM cell. Of course, other numbers of data values can be stored based on the resistance, linearity, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A resistive switching memory device, comprising:
   a) a plurality of resistive memory cells, wherein each of the resistive memory cells comprises a storage element configured to be programmed to a low resistance state by application of a first voltage in a forward bias direction, and to be erased to a high resistance state by application of a second voltage in a reverse bias direction;
   b) a plurality of common plates, wherein each of the common plates is connected to a subset of the plurality of resistive memory cells at an anode or a cathode of the storage element;
   c) a command detector configured to detect a write command that is to be executed on the resistive switching memory device as a first write operation followed by a second write operation; and
   d) a write controller configured to perform the first write operation on each resistive memory cell in a selected of the subsets of resistive memory cells, and to perform the second write operation on at least one of the resistive memory cells in the selected subset based on the detected write command, wherein one of the first and second write operations is a verify operation, and wherein the first and second write operations are performed with a same bias direction on the common plate with respect to a bit line for the selected subset.

2. The resistive switching memory device of claim 1, wherein:
   a) the first write operation comprises a program operation; and
   b) the second write operation comprises a program verify operation.

3. The resistive switching memory device of claim 1, wherein:
   a) the first write operation comprises a program verify operation; and
   b) the second write operation comprises a program operation.

4. The resistive switching memory device of claim 1, wherein:
   a) the first write operation comprises an erase operation; and
   b) the second write operation comprises an erase verify operation.

5. The resistive switching memory device of claim 1, wherein:
   a) the first write operation comprises an erase verify operation; and
   b) the second write operation comprises an erase operation.

6. The resistive switching memory device of claim 1, further comprising a sensing circuit coupled to at least one of the plurality of resistive memory cells, wherein the sensing circuit is configured to read a data state of the at least one resistive memory cell by application of a third voltage in the forward bias direction or the reverse bias direction.

7. The resistive switching memory device of claim 6, wherein the sensing circuit is configured to read the data state of the at least one resistive memory cell by application of the third voltage in the forward bias direction for a program verify operation.

8. The resistive switching memory device of claim 6, wherein the sensing circuit is configured to read the data state of the at least one resistive memory cell by application of the third voltage in the reverse bias direction for an erase verify operation.

9. The resistive switching memory device of claim 1, wherein each of the common plates is connected to the subset of the plurality of resistive memory cells by a common anode, and wherein a source of an access transistor in each resistive memory cell is connected to a bit line.

10. The resistive switching memory device of claim 1, wherein each of the common plates is connected to the subset of the plurality of resistive memory cells by a common cathode, and wherein a drain of an access transistor in each resistive memory cell is connected to a bit line.

11. The resistive switching memory device of claim 1, wherein each of the common plates is connected to the subset of the plurality of resistive memory cells along one or more bit lines.

12. The resistive switching memory device of claim 11, wherein each of the one or more bit lines is coupled to resistive memory cells configured to store a page of data.

13. The resistive switching memory device of claim 1, wherein each of the common plates is connected to the subset of the plurality of resistive memory cells along word lines.

14. The resistive switching memory device of claim 13, wherein each of the word lines is coupled to resistive memory cells configured to store a page of data.

15. The resistive switching memory device of claim 1, wherein a voltage change on the common plate for the selected subset when going from the first write operation to the second write operation is minimized.

16. The resistive switching memory device of claim 1, further comprising a register configured to store a result from at least one of the first and second write operations.

17. A method of controlling a resistive switching memory device having a plurality of resistive memory cells arranged as subsets corresponding to common plates, the method comprising:
   a) detecting a write command to be executed as first and second write operations on the resistive switching memory device, wherein each of the resistive memory cells comprises a storage element that is programmable to a low resistance state by application of a first voltage in a forward bias direction, and erasable to a high resistance state by application of a second voltage in a reverse bias direction;
   b) performing the first write operation on each resistive memory cell in a selected subset of the plurality of resistive memory cells having a common plate connected thereto at an anode or a cathode of the storage element; and
   c) performing the second write operation on at least one of the resistive memory cells in the selected subset based on the detected write command, wherein one of the first and second write operations comprises is a verify operation, and wherein the first and second write operations are performed with a same bias direction on the common plate with respect to a bit line for the selected subset.

18. The method of claim 17, further comprising storing a result from at least one of the first and second write operations in a register.

19. The method of claim 17, wherein:
   a) the first write operation comprises a program operation or an erase operation; and
   b) the second write operation comprises a program verify operation or an erase verify operation.

20. The method of claim 17, wherein:
   a) the first write operation comprises a program verify operation or an erase verify operation; and
   b) the second write operation comprises a program operation or an erase operation.

* * * * *